United States Patent
Hsu

(10) Patent No.: US 8,362,870 B2
(45) Date of Patent: Jan. 29, 2013

(54) IMPEDANCE CALIBRATION CIRCUIT WITH UNIFORM STEP HEIGHTS

(75) Inventor: Ying-Yu Hsu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 235 days.

(21) Appl. No.: 12/859,920

(22) Filed: Aug. 20, 2010

(65) Prior Publication Data

US 2011/0109422 A1    May 12, 2011

Related U.S. Application Data

(60) Provisional application No. 61/259,931, filed on Nov. 10, 2009.

(51) Int. Cl.
   *H01C 13/00*    (2006.01)
(52) U.S. Cl. ........................ 338/215; 341/154
(58) Field of Classification Search .............. 338/215, 338/295, 201
   See application file for complete search history.

(56) References Cited

U.S. PATENT DOCUMENTS

| | | | | |
|---|---|---|---|---|
| 4,542,368 A * | 9/1985 | Lillis | | 341/120 |
| 5,969,658 A | 10/1999 | Naylor | | |
| 6,549,066 B1 * | 4/2003 | Martin | | 327/552 |
| 6,937,179 B1 * | 8/2005 | Martin | | 341/154 |
| 6,980,020 B2 | 12/2005 | Best et al. | | |
| 7,400,165 B2 | 7/2008 | Park | | |
| 7,602,327 B2 * | 10/2009 | Din et al. | | 341/154 |
| 7,671,661 B2 * | 3/2010 | Jung et al. | | 327/512 |
| 7,710,302 B2 * | 5/2010 | Iadanza et al. | | 341/154 |
| 7,750,716 B2 * | 7/2010 | Hosoya | | 327/308 |
| 2009/0140765 A1 * | 6/2009 | Chen | | 326/30 |

OTHER PUBLICATIONS

Koo, K-H, et al., "A Versatile I/O with Robust Impedance Calibration for Various Memory Interfaces," ISCAS 2006, pp. 1003-1006.

Ihm, J-D, et al., "An 80nm 4Gb/s/pin 32b 512Mb GDDR4 Graphics DRAM with Low-Power and Low-Noise Data-Bus Inversion," IEEE International Solid-State Circuits Conference, Feb. 14, 2007, Session 27, 3 pages.

* cited by examiner

Primary Examiner — Kyung Lee
(74) Attorney, Agent, or Firm — Slater & Matsil, L.L.P.

(57) ABSTRACT

An integrated circuit includes a first connection line; a second connection line; a plurality of tuning resistors with each having a sequence number and being coupled between the first connection line and the second connection line; and a plurality of switches, with each being coupled in series with one of the plurality of tuning resistors. The sequence numbers of the plurality of tuning resistors are continuous. The resistance values of the plurality of tuning resistors are a function of the respective sequence numbers.

19 Claims, 6 Drawing Sheets

| | |
|---|---|
| 283.08 | > 25.7 |
| 257.34 | > 21.4 |
| 235.90 | ... |
| 217.75 | |
| 202.20 | |
| 188.72 | |
| 176.92 | |
| 166.52 | |
| 157.27 | |
| 148.99 | |
| 141.54 | |
| 134.80 | |
| 128.67 | |
| 123.08 | |
| 117.95 | |
| 113.23 | |

IMPEDANCE CALIBRATION CIRCUIT WITH UNIFORM STEP HEIGHTS

This application claims the benefit of U.S. Provisional Application No. 61/259,931 filed on Nov. 10, 2009, entitled "Impedance Calibration Circuit with Uniform Step Heights," which application is hereby incorporated herein by reference.

TECHNICAL FIELD

This disclosure relates generally to integrated circuits, and more particularly to impedance calibration circuits used for multi-slew-rate off-chip drivers (OCDs) and on-die terminators (ODTs).

BACKGROUND

When data signals are communicated between circuit devices, reflection of the data signals occurs if the impedances of devices mismatch with each other. Thus, an information signal exchange system requires a terminal circuit for proving a terminal impedance and for terminating a signal transmission line, and the terminal circuit needs to have an impedance matching the impedance of the signal transmission line. The terminal circuit suppresses the reflection of a received signal to raise the integrity of the transferred signals. The terminal circuit may be used for multi-slew-rate off-chip drivers (OCDs) and on-die terminators (ODTs).

The terminal circuit may be located inside or outside of a semiconductor chip, which typically has integrated circuits for processing the data signals. The terminal circuit in a semiconductor chip is usually referred to as an on-chip terminator, on-die terminator, or active terminator.

FIG. 1 illustrates a conventional terminal circuit, which includes a plurality of resistors R', each having a resistance that is also denoted as R'. The terminal circuit may be inside a chip. Each of the resistors R' is serially connected to one switch. When a switch is closed, the respective resistor is connected in parallel to other resistors whose respective switches are also closed. Accordingly, the resistance of the terminal circuit may be adjusted by connecting a different number of resistors in parallel.

The resistance (impedance) of the terminal circuit is determined by the number of connected resistors. For example, if a number k of resistors are connected in parallel, the resistance of the resistor is R'/k. FIG. 2 illustrates the resistance of the terminal circuit as a function of number k. It is observed that the resistance of the terminal circuit is in a log scale, and the step heights (the differences in resistance values caused by connecting additional resistors) are not linear. With the increase in number k, the step heights become increasing smaller.

FIG. 2 also illustrates two lines representing the resistances of the terminal circuit in a slow-slow (SS) process corner and a fast-fast (FF) process corner. For each of the lines, the data with the highest resistance is obtained when only one resistor R' is connected. From left to right, the number of connected resistors increases. At the SS corner, the resistance of the terminal circuit is higher than at the FF corner, and hence to achieve a pre-determined target resistance, more resistors have to be connected. Accordingly, when the target resistance is reached, with a great number of resistors being connected, the respective step heights may become too small. This requires the comparator (not shown) for determining the resistance of the terminal circuit to be very accurate. For example, in a 240-Ohm on-die terminal circuit, the comparator needs to have an accuracy of 5 mV. This is a very demanding requirement. If such an accuracy cannot be met, quantization errors may occur, and an additional circuit is further needed to handle the possible quantization errors.

At the FF corner, on the other hand, a smaller number of resistors need to be connected to achieve the target resistance. However, this means that the first couple of steps may be too high to meet the specification, and the respective steps cannot be used. FIG. 3 illustrates the resistances of a 240-Ohm on-die terminal circuit. It is shown that such a terminal circuit requires 15 steps. Unfortunately, the first step height (the difference between the first two resistances) is (283.08-257.34) Ohms, which is 25.7 Ohms. This step height exceeds 10 percent (24 Ohms) of the target resistance (240 Ohms), and cannot be used. Accordingly, the first step is wasted. In addition, the conventional terminal circuit occupies a relatively big chip area, partially due to the big number of required steps.

SUMMARY

In accordance with one aspect of the embodiment, an integrated circuit includes a first connection line; a second connection line; a plurality of tuning resistors with each having a sequence number and being coupled between the first connection line and the second connection line; and a plurality of switches, with each being coupled in series with one of the plurality of tuning resistors. The sequence numbers of the plurality of tuning resistors are continuous. The resistance values of the plurality of tuning resistors are a function of the respective sequence numbers.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

A novel terminal circuit in accordance with an embodiment is provided. The variations and the operation of the embodiment are then discussed. Throughout the various views and illustrative embodiments, like reference numbers are used to designate like elements.

Figure 4:
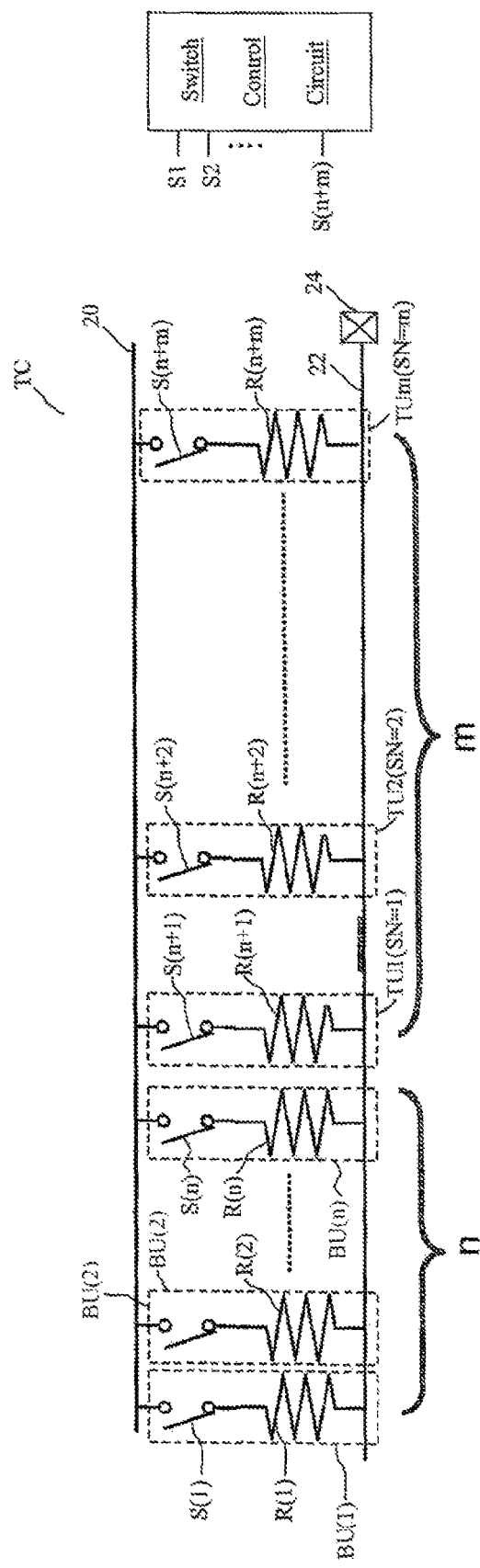
FIG. 4 illustrates a terminal circuit in accordance with an embodiment.

FIG. 4 illustrates an exemplary terminal circuit TC, which includes connection lines 20 and 22. Connection line 20 may be a power rail. Connection line 22 may be connected to pad 24, which may be an output pad. A plurality of resistors R(1) through R(n+m) are coupled between connection lines 20 and 22, wherein n and m are integers that may be greater than 3, 5, 10, 15, or even higher, depending on the desirable target resistance and the desirable step heights. Each of resistors R(1) through R(n+m) is further connected in series to one of respective switches S(1) through S(n+m). When one or some of the switches S(1) through S(n+m) is closed, the respective serially connected resistors R(1) through R(n+m) contribute to the overall resistance RTC of terminal circuit TC. Otherwise, the respective serially connected resistors do not contribute to resistance RTC.

Figure 1:
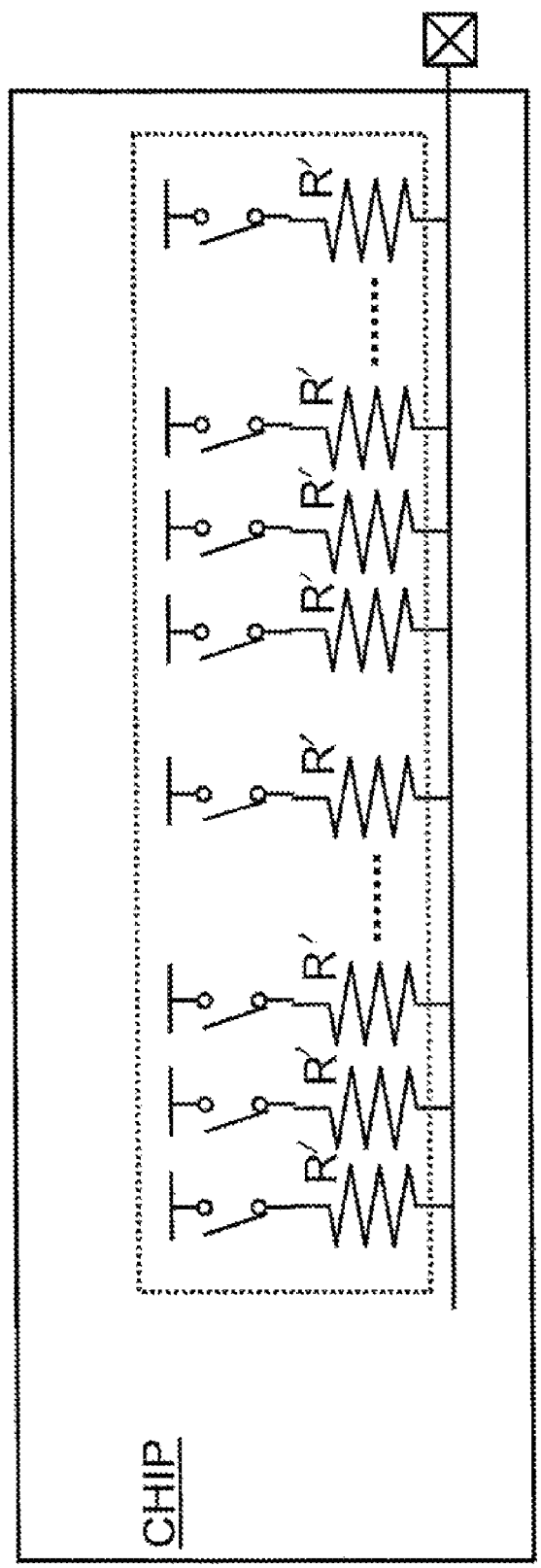
FIG. 1 illustrates a conventional terminal circuit comprising a plurality number of resistors with equal resistances.
Figures 2, 3:
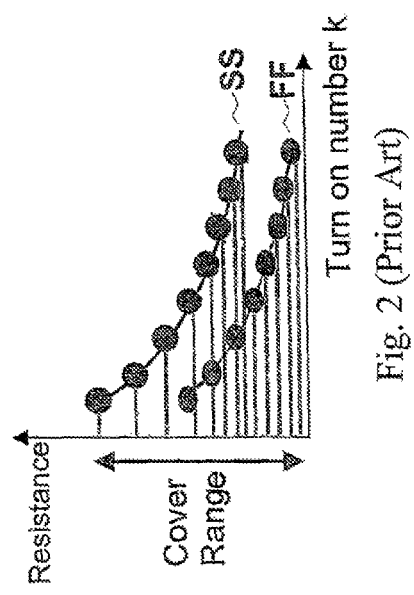
FIG. 2 illustrates the resistances of the circuit shown in FIG. 1 as a function of the number of connected resistors.
FIG. 3 illustrates the resistance values of the circuit shown in FIG. 1.

Switches S(1) through S(n+m) may be controlled by a switch control circuit that operates to control which of the switches need to be closed (so that the respective resistors are connected), and which of the switches need to be opened. With the operation of the switch control circuit, more or fewer number of resistors R(1) through R(n+m) are connected, and hence resistance RTC may be tuned to a target resistance. In an embodiment, the determination of resistance RTC is performed by a comparator (not shown in FIG. 1, please refer to comparator CMP in FIG. 6).

Terminal circuit TC may include basic resistors R(1) through R(n) and tuning resistors R(n+1) through R(n+m). In an embodiment, basic resistors R(1) through R(n) have same resistance R, wherein resistance R is referred to as a (common) reference resistance throughout the description. Accordingly, if all basic resistors are connected, the overall resistance of basic resistors R(1) through R(n) will be R/n. In alternative embodiments, the number of basic resistors and the resistance values of the basic resistors may be changed. However, the overall resistance of all basic resistors may still be R/n. For example, the basic resistors may include only one resistor with a resistance R/n, or n/2 number of resistors with each having the resistance R/2, and so on.

Each of the tuning resistors R(n+1) through R(n+m) may be identified with a sequence number SN. For example, the first tuning resistor R(n+1) has the sequence number SN=1, the second tuning resistor R(n+2) has the sequence number SN=2, and the mth tuning resistor R(n+m) has the sequence number SN=m, wherein m may be any integer equal to or greater than 3, 5, or even 10. The sequence numbers SN may be continuous, that is, if there is a resistor having the sequence number P+1 (with P being a positive integer), there will be a resistor having the sequence number P (and resistors with sequence numbers ranging from 1 all the way to P). The resistances of each of the tuning resistors may be expressed as $R(n-SN)(n-SN+1)/(n^2)$. Accordingly, the first tuning resistor with the sequence number SN=1 has resistance $R(n-1)/n$, the second tuning resistor with the sequence number SN=2 has resistance $R(n-1)(n-2)/n^2$ ... and the last tuning resistor with the sequence number SN=m has resistance $R(n-m)(n-m+1)/n^2$. With the increase in the sequence number SN, the resistances of the respective tuning resistors decrease. Throughout the discussion, each of the resistors R(1) through R(n+m) and its respective switch in combination are also referred to as a resistor unit, and the resistor units are also referred to as having the sequence number SN of the respective resistor. The resistor units are referred to as basic resistor units BU(1) through BU(n), and tuning resistors units TU(1) through TU(m).

Basic resistors R(1) through R(n) may be used as an integrated unit, and may either be all connected (with the respective switch being closed), or all disconnected (with the respective switch being opened). The simultaneous connection or disconnection of basic resistor units BU(1) through BU(n) is controlled by the switch control unit. With the basic resistors R(1) through R(n) all connected to contribute resistance R/n to terminal circuit TC, tuning resistors R(n+1) through R(n+m) may be sequentially connected one by one to further tune resistance RTC. In an embodiment, a resistor with sequence number L (with L<=m) may be connected only if the basic resistors R(1) through R(n) are all connected, and all tuning resistors with sequence numbers SN smaller than L are all connected. Again, the synchronization of corresponding switches is controlled by the switch control circuit. In other words, in an exemplary embodiment, a switch as shown in FIG. 4 will not be closed unless all switches on its left are closed.

With the sequential connection of tuning resistors R(n+1) through R(n+m), the resistance RTC of the terminal circuit TC is calculated as follows. In the following calculation, the already-connected resistors are treated as a single resistor, and its resistance, which would have been calculated, is used to simplify the calculation of the overall resistance RTC when an additional resistor is connected.

With all basic connectors R(1) through R(n) being connected and no tuning resistors being connected, resistance RTC may be expressed as:

$$RTC=R(1/n) \qquad [Eq. 1]$$

If additional tuning resistor R(n+1) (with the sequence number SN=1 and the resistance being $R(n-1)/n$) is connected in addition to all connected basic resistors, resistance RTC may be expressed as:

$$RTC=R(1/n)//R(n-1)/n=R(1/n)((n-1)/n) \qquad [Eq. 2]$$

If additional resistor R(n+2) (with the sequence number SN=2 and the resistance being $R((n-1)(n-2)/n^2)$ is connected in addition to the already-connected resistors, resistance RTC may be expressed as:

$$RTC=R(1/n)((n-1)/n)//R((n-1)(n-2)/n^2)=R(1/n)((n-2)/n) \qquad [Eq. 3]$$

If additional resistor R(n+3) (with the sequence number SN=2 and the resistance being $R((n-2)(n-3)/n^2)$ is connected in addition to all previously connected resistors, resistance RTC may be expressed as:

$$RTC=R((1/n)(n-2)/n)//R((n-2)(n-3)/n^2)//=R(1/n)((n-3)/n) \qquad [Eq. 4]$$

The calculation may be continued for each of additional tuning resistors R(n+4) through R(n+m). When the last tuning resistor R(n+m) is connected, resistance RTC is:

$$RTC=R(1/n)((n-m+1)/n)//R((n-m+1)(n-m)/n)=R(1/n)((n-m)/n) \qquad [Eq. 5]$$

Figure 5:
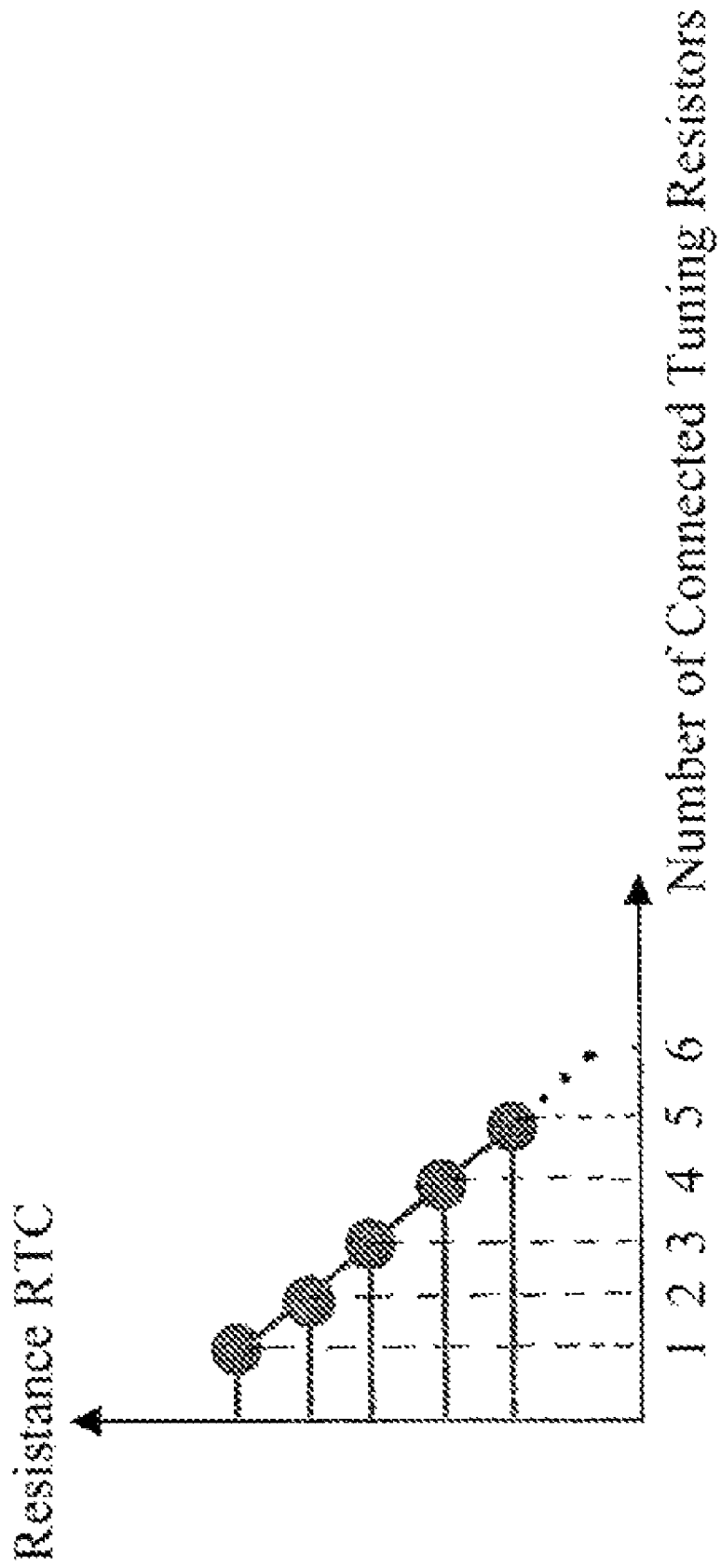
FIG. 5 illustrates the resistance of the circuit shown in FIG. 4 as a function of the number of connected tuning resistors.

Overall, if resistor R(n+SN) is connected, while resistor R(n+SN+1) is not connected, resistance RTC of terminal circuit TC is $R(1/n)((n-SN)/n)$. Clearly, further connecting resistor R(n+SN+1) will cause the resistance to drop from $R(1/n)((n-SN)/n)$ to $R(1/n)((n-SN-1)/n)$, with the difference (step height) in resistance RTC being $R(1/n^2)$. In other words, the step heights are all $R(1/n^2)$, which are a constant that do not change with the increase in the number of connected resistors. FIG. 5 illustrates the resistance RTC as a function of the number of connected tuning resistors. It is observed that the resistance RTC is linear relative to the number of connected tuning resistors.

In the embodiments shown in FIG. 4, the resolution of the terminal circuit TC may be easily tuned by tuning number n, which may be increased to a number greater enough so that design requirements may be met. The number of steps, on the other hand, may be adjusted through adjusting number m (the number of tuning resistors). Accordingly, by adjusting resistance value R and integers n and m, the resistance range covered by terminal circuit TC can be easily adjusted.

Figures 6, 7:
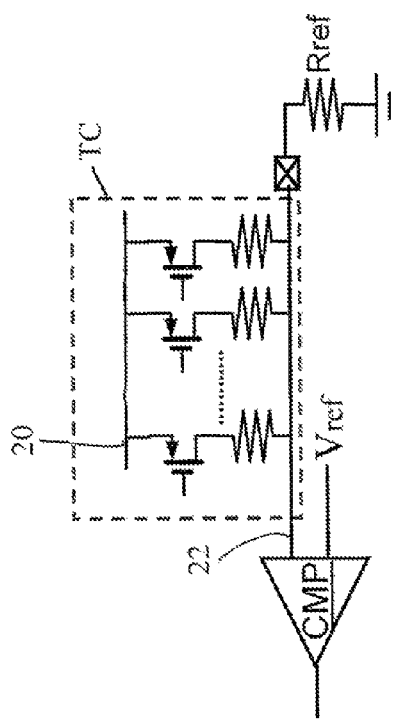
FIG. 6 illustrates an exemplary terminal circuit adopting the embodiment shown in FIG. 4.
FIG. 7 illustrates the resistance values of the circuit shown in FIG. 6.

FIG. 6 illustrates an exemplary circuit adopting the terminal circuit TC as shown in FIG. 4. Comparator CMP may be used to determine how many resistors in terminal circuit TC need to be connected, so that the overall resistance RTC of terminal circuit TC may be as close to the resistance of reference resistor Rref as possible. Connection line 22 may be connected to one input node of comparator CMP, while the other input node of comparator CMP may be connected to reference voltage Vref.

Using the circuit as shown in FIG. 6, with an exemplary target resistance being 240 Ohms, the values as shown in FIG. 7 may be obtained from simulations of FF process corners. The first column in FIG. 7 shows the resistance values RTC, while the second column shows the step heights (the differences between resistance values RTC). It is noted that the step heights are very stable, and range between about 12.5 Ohms to about 13 Ohms. All of the steps are usable since the respective step heights are smaller than 10 percent (24 Ohms) of the exemplary target resistance (240 Ohms), assuming 24 Ohms is the maximum allowable step height. In addition, the resulting RTC may cover from about 122 Ohms to about 250 Ohms using only ten steps. The accuracy of comparator CMP only needs to be about 11 mV in order to meet the design specification. As a comparison, the accuracy of a conventional terminal circuit may need to be as high as about 5 mV. With the relaxed accuracy requirement to comparator CMP, quantization errors are less likely to occur. The same embodiment as shown in FIG. 4 may be applied to other circuits, such as a 50-Ohm terminal circuit. Similar results are obtained from the 50-Ohm terminator.

Figure 8:
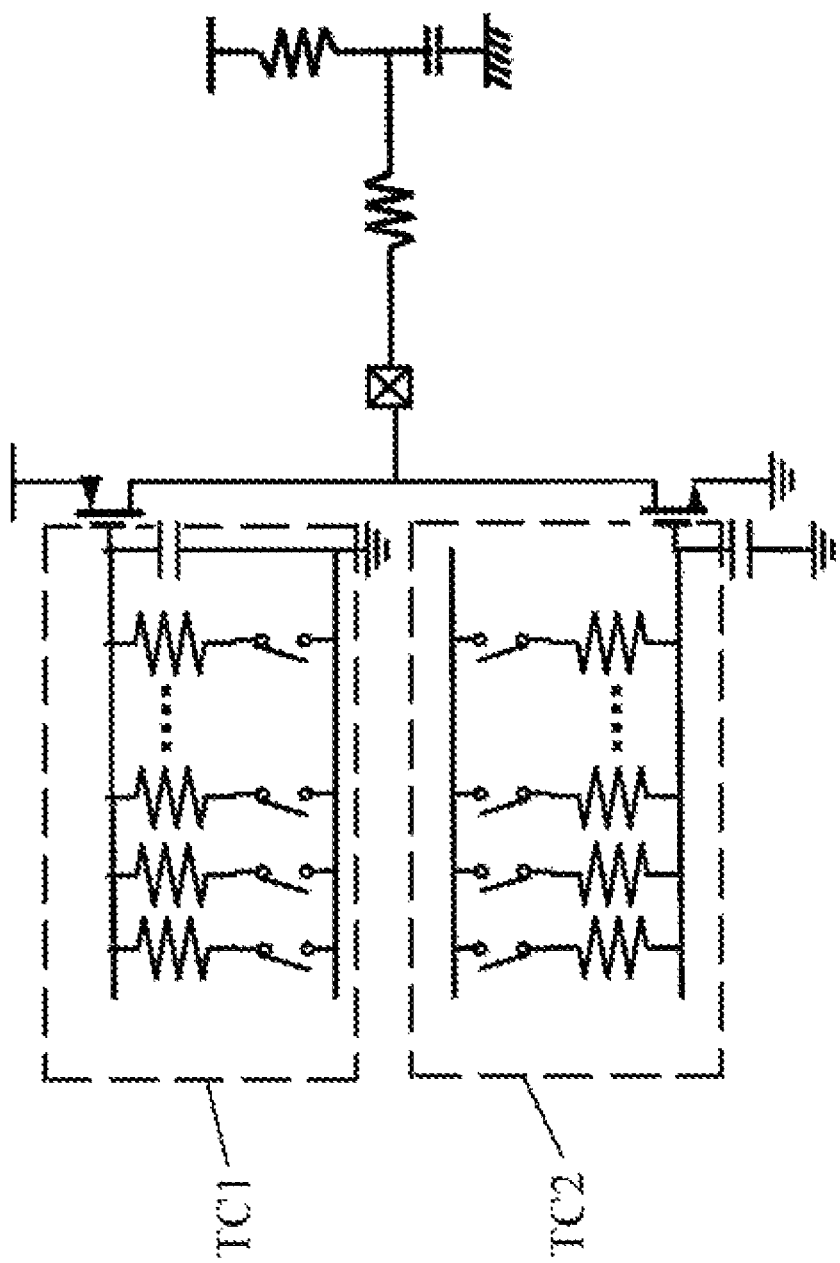
FIG. 8 illustrates terminal circuits used in a multi-slew rate off-chip driver.

Further, in an embodiment, a multi-slew rate off-chip driver (as shown in FIG. 8) adopting the concept of terminal circuit TC (denoted as TC1 and TC2) may have the slew rates of 1.82E-10, 2.12E-10, 2.41E-10 and 2.72E-10 seconds. Again, the slew rates have uniform differences of about 0.3E-10 seconds. With the uniform differences in the slew-rates, less steps may be needed to cover a greater range of slew rates.

In the embodiments of the present disclosure, the tuning in resistances is in a linear scale, and the step heights (or tuning resolution) are uniform, allowing a greater range of resistance (or slew rate) to be covered, while at the same time, the steps (the number of resistors) may be reduced. With relaxed accuracy requirements to comparators, quantization errors are less likely to occur. Further, the reduction in the number of steps results in the reduction in the required chip area.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit comprising:
    a first connection line;
    a second connection line;
    a plurality of tuning resistors with each having a sequence number and being coupled between the first connection line and the second connection line, wherein the sequence numbers of the plurality of tuning resistors are continuous, and wherein resistance values of the plurality of tuning resistors are a function of the respective sequence numbers; and
    a plurality of switches, with each being coupled in series with one of the plurality of tuning resistors.

2. The integrated circuit of claim 1, wherein each of the plurality of switches forms a resistor unit with one of the plurality of tuning resistors, and wherein a first end of the resistor unit is directly connected to the first connection line, and a second end of the resistor unit is directly connected to the second connection line.

3. The integrated circuit of claim 1, wherein a resistance value of each of the plurality of tuning resistors is $R((n-SN)/n)((n-SN+1)/n)$, with n being an integer, R being a common reference resistance value, and SN being the sequence number of the each of the plurality of tuning resistors.

4. The integrated circuit of claim 3 further comprising a basic resistor unit coupled between the first connection line and the second connection line, wherein a resistance value of the basic resistor unit is equal to the common reference resistance value R.

5. The integrated circuit of claim 3 further comprising at least one basic resistor unit coupled between the first connection line and the second connection line, wherein an overall resistance value of the at least one basic resistor unit is R/n.

6. The integrated circuit of claim 5, wherein the at least one basic resistor unit comprises n resistors coupled in parallel, and wherein a resistance of each of the n resistors is equal to the common reference resistance value R.

7. The integrated circuit of claim 1, wherein the sequence numbers of the plurality of tuning resistors start from 1.

8. The integrated circuit of claim 1 further comprising a switch control circuit coupled to the plurality of switches, wherein the switch control circuit is configured to close the plurality of switches according to the sequence numbers of the respective connecting tuning resistors, with no switch being closed without all resistors having smaller sequence numbers being connected.

9. An integrated circuit comprising:
    a first connection line;
    a second connection line;
    a plurality of basic resistors coupled between the first connection line and the second connection line, wherein a resistance of each of the plurality of basic resistors is R with R being a reference resistance value, and a total number of all of the plurality of basic resistors is integer n with n being greater than 3; and
    a plurality of tuning resistor units with each having a sequence number and being coupled between the first connection line and the second connection line, wherein each of the plurality of tuning resistor units comprises a switch and a tuning resistor coupled in series with the switch, and wherein resistance values of the tuning resistors in the plurality of tuning resistor units are functions of the respective sequence numbers and integer n.

10. The integrated circuit of claim 9, wherein the sequence numbers of the plurality of tuning resistor units are continuous, and wherein the sequence numbers of the plurality of tuning resistor units start from 1.

11. The integrated circuit of claim 9, wherein with an increase in the sequence number of the tuning resistors, resistance values of the respective tuning resistors decreases.

12. The integrated circuit of claim 9, wherein the resistance values of the tuning resistors in the plurality of tuning resistors are R((n−SN)/n)((n−SN+1)/n), with SN being a sequence number of the respective one of the plurality of tuning resistor units.

13. The integrated circuit of claim 9 further comprising a switch control circuit coupled to the switches in the plurality of tuning resistor units, wherein the switch control circuit is configured to close the plurality of switches according to the sequence numbers of the respective connecting resistors, with no switch being closed without all tuning resistors having smaller sequence numbers being connected to the first connection line and the second connection line.

14. The integrated circuit of claim 13 further comprising a plurality of switches, each being coupled in series with one of the plurality of basic resistors, wherein the switch control circuit is configured to close or open the plurality of switches simultaneously.

15. The integrated circuit of claim 9 further comprising a comparator comprising one input node coupled to one of the first connection line and the second connection line.

16. An integrated circuit comprising:
a first connection line;
a second connection line;
a plurality of basic resistor units coupled between the first connection line and the second connection line, wherein the plurality of basic resistor units has equal resistance values R, and wherein a total number of the plurality of basic resistor units is n; and
a plurality of tuning resistor units with each having a sequence number SN and being coupled between the first connection line and the second connection line, wherein the sequence numbers of the plurality of tuning resistor units are continuous, and wherein resistance values of the plurality of tuning resistor units are R((n−SN)/n)((n−SN+1)/n), with SN being a sequence number of the respective one of the plurality of tuning resistor units.

17. The integrated circuit of claim 16, wherein the sequence numbers of the plurality of tuning resistor units start from 1 and end at an integer greater than 3.

18. The integrated circuit of claim 17, wherein the sequence numbers of the plurality of tuning resistor units end at the integer equal to or greater than 5.

19. The integrated circuit of claim 16, wherein each of the plurality of tuning resistor units and each of the plurality of basic resistor units comprises a switch and a resistor coupled in series.

* * * * *